(12) United States Patent
Sorbel et al.

(10) Patent No.: US 11,646,805 B2
(45) Date of Patent: May 9, 2023

(54) ADVANCED RADIO FREQUENCY BIDIRECTIONAL REFLECTANCE DISTRIBUTION FUNCTION MEASUREMENT DEVICE

(71) Applicant: Raytheon Company, Waltham, MA (US)

(72) Inventors: Scott R. Sorbel, Tucson, AZ (US); Clayton Spann, Corona de Tucson, AZ (US); Robert D. Johnson, Tucson, AZ (US); James A. McDaniel, Tucson, AZ (US); William Barrett, III, Tucson, AZ (US); Peter S. Ford, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 353 days.

(21) Appl. No.: 16/939,687

(22) Filed: Jul. 27, 2020

(65) Prior Publication Data

US 2022/0029714 A1 Jan. 27, 2022

(51) Int. Cl.
*H04B 17/10* (2015.01)
*G01R 29/08* (2006.01)

(52) U.S. Cl.
CPC ....... *H04B 17/103* (2015.01); *G01R 29/0821* (2013.01)

(58) Field of Classification Search
CPC .......... H04B 17/103; G01R 29/0821
See application file for complete search history.

(56) References Cited

U.S. PATENT DOCUMENTS

| 2012/0169554 | A1* | 7/2012 | Behdad | H01Q 9/40 |
| | | | | 343/742 |
| 2012/0241616 | A1* | 9/2012 | Axelrod | H01Q 15/0086 |
| | | | | 250/336.1 |
| 2015/0236415 | A1* | 8/2015 | Bily | H01Q 3/34 |
| | | | | 342/372 |
| 2019/0081618 | A1* | 3/2019 | Liu | H03K 5/00 |

OTHER PUBLICATIONS

Brady, D. J.; Optical imaging and spectroscopy; Wiley, 2009; Intro.
Brown, W. M.; Synthetic Aperture Radar; IEEE T Aero Elec Sys Aes3, 217 (1967).
Ding et al.; Ultrathin Pancharatnam-Berry Metasurface with Maximal Cross-Polarization Efficiency; Adv Mater 27, 1195-1200; 2015.
(Continued)

*Primary Examiner* — Junpeng Chen
(74) *Attorney, Agent, or Firm* — Renner, Otto, Boisselle & Sklar, LLP (57) ABSTRACT

A measurement system utilizing metasurfaces and compressive sensing is provided that measures specular and diffuse RF reflection properties of a sample omnidirectionally across a broad frequency regime in a monostatic, bistatic, or BRDF sense. The measurement system may be used to measure the full hemispherical (or spherical) reflection from a target that has been illuminated in a monostatic or bistatic case. The measurement system may also be used to measure the full BRDF of a sample or spatially complex bistatic reflections from a sample.

19 Claims, 5 Drawing Sheets

(56) References Cited

OTHER PUBLICATIONS

Engheta et al.; Metamaterials: physics and engineering explorations; Wiley-Interscience; 2006.
Fenn et al.; The development of phased-array radar technology; Lincoln Laboratory Journal 12, 321-340; 2000.
Fromenteze et al.; Computational imaging using a mode-mixing cavity at microwave frequencies; Appl Phys Lett 106; 2015.
Gollub, et.al.; "Large Metasurface Aperture for Millimeter Wave Computational Imaging at the Human-Scale"; Scientific Reports, 7:42650; 2017.
Holloway et al.; An Overview of the Theory and Applications of Metasurfaces: The Two-Dimensional Equivalents of Metamaterials; IEEE Antenn Propag M 54, 10-35; 2012.
Hunt et al.; Metamaterial Apertures for Computational Imaging; Science 339, pp. 310-313; 2013.
Imani et al; Analytical modeling of printed metasurface cavities for computational imaging. Journal of Applied Physics 120, 144903; 2016.
Lipworth, et.al.; "Comprehensive Simulation platform for a metamaterial imaging system"; vol. 54, No. 31; Nov. 1, 2015; Applied Optics.
Liu et al.; A comparison of truncated total least squares with Tikhonov regularization in imaging by ultrasound inverse scattering; Phys Med Biol 48, 2437-2451; 2003.
Marks et al; Spatially resolving antenna arrays using frequency diversity; JOSA A 33, 899-912; 2016.
Skolnik; M. I. Radar handbook 3rd edn; McGraw-Hill, 2008; Summary PDF.
Yurduseven et al.; Multistatic Microwave Imaging with Arrays of Planar Cavities; IET Microwaves, Antennas & Propagation 10, 1174-1181; 2016.
Yurduseven et al.; Printed Aperiodic Cavity for Computational and Microwave Imaging. IEEE Microw Wirel Co 26, 367-369; 2016.
Yurduseven et al.; Resolution of the Frequency Diverse Metamaterial Aperture Imager. Prog Electromagn Res 150, 97-107; 2015.
Yurduseven et al; Frequency-diverse microwave imaging using planar Mills-Cross cavity apertures; Opt. Express 24, 8907-8925; 2016.

\* cited by examiner

ADVANCED RADIO FREQUENCY BIDIRECTIONAL REFLECTANCE DISTRIBUTION FUNCTION MEASUREMENT DEVICE

FIELD OF INVENTION

The present disclosure relates generally to measuring the radio frequency response of materials or objects of shape and more particularly to measuring bidirectional reflectance distribution function (BRDF) in the radio frequency regime.

BACKGROUND

Advanced development of radio frequency (RF) materials allow for control of electromagnetic energy with improved spatial and frequency performance. To measure the radio frequency properties of such materials, different measurement systems can be used to measure the direct hemispherical reflectance (DHR) or bidirectional reflectance distribution function (BRDF) of the material. Such measurement systems typically consist of either a multi-measurement RF system that does not capture the full radio frequency (RF) BRDF or bistatic reflection properly in terms of spatial fidelity or a chamber with a series of moving transmitting (Tx)/receiving (Rx) horns that take time to move, position, and take measurements.

SUMMARY

In a general embodiment, a measurement system utilizing metasurfaces (i.e., 2D metamaterials) and compressive sensing is provided that measures specular and diffuse RF reflection properties of a sample omnidirectionally across a broad frequency regime in a monostatic, bistatic, or BRDF sense. For example, the measurement system may be used to measure the full hemispherical (or spherical, approximately 4 π steradians) reflection from a target that has been illuminated in a monostatic or bistatic case. The measurement system may also be used to measure the full BRDF of a sample or spatially complex bistatic reflections from a sample.

In an embodiment, the measurement system described herein combines the radio frequency performance of an engineered metamaterial structure/metasurface pattern with an imaging system utilizing multi-spectral radio frequency bands that can obtain the full 2π BRDF (including monostatic and bistatic phenomenologies) in one capture. By adjusting the thickness and substrate material properties of the dielectric, novel scattering behavior may be realized.

The measurement system described herein may be used to measure large radio frequency spectral bandwidth areas in a full BRDF or 2π measurement that typically were inaccessible due to limited reflectance measurement systems that could be limited to one plane (e.g. Directional Hemispherical Reflectance that provides reflection versus AOI).

The measuring system may include the ability to selectively acquire spatially and temporally complex electromagnetic sources and BRDF reflection profiles (in addition to monostatic and bistatic reflection measurements). The system may employ a comparably small number of RF sensors, yet be able to reconstruct the segregated signals with high fidelity in time and space. The panels included in the measurement system may be simple and robust, because the passive metamaterial structure modulates the signal (which has the advantages of low cost and low complexity).

According to one aspect, there is provided a panel including an electrically-conductive top plate, an electrically-conductive ground plate, a dielectric layer, and a radio frequency sensor. The dielectric layer including a substrate, located between the top plate and the ground plate. The top plate includes a radio frequency metamaterial surface configured to encode a frequency and directionality of a radio frequency input received from a sample to produce an encoded radio frequency signal. The radio frequency sensor operatively coupled to the top plate and configured to detect the encoded radio frequency signal and output a signal based on the detected encoded radio frequency signal.

Alternatively or additionally, the metamaterial surface includes one or more patterns. Each pattern of the one or more patterns is sensitive to a predetermined wavelength range of electromagnetic radiation such that, when electromagnetic radiation in the predetermined wavelength range is incident upon the pattern, the encoded radio frequency signal is generated in the top plate.

Alternatively or additionally, the one or more patterns include a plurality of patterns. The plurality of patterns vary spatially across the top plate, such that different locations along the top plate are sensitive to different wavelength ranges of electromagnetic radiation.

Alternatively or additionally, the top plate is made of metal. The pattern is formed from metal by at least one of adding metal to a surface of the top plate or altering the metal of the surface of the top plate.

Alternatively or additionally, the radio frequency metamaterial encodes the radio frequency input as the encoded radio frequency signal by shifting a property of the radio frequency input based on a location on the top plate where the radio frequency input was received. The property is at least one of a frequency, a phase, or an amplitude of the encoded signal.

Alternatively or additionally, the property includes the frequency.

Alternatively or additionally, the top plate is configured to generate electromagnetic radiation based on an input signal received from the radio frequency sensor, such that the electromagnetic radiation is emitted by the top plate and interacts with the sample and is received as the radio frequency input by the radio frequency metamaterial.

Alternatively or additionally, the panel in combination with additional panels as part of a measurement system. The panel and the additional panels are arranged, such that the top plate of the panel and the additional panels form at least a portion of a hemispherical shape.

Alternatively or additionally, further in combination with an electromagnetic radiation source positioned outside of the hemispherical shape such that electromagnetic radiation generated by the electromagnetic radiation source interacts with the sample and is received as the radio frequency input by at least one of the panel and the additional panels. The hemispherical shape includes an opening. The electromagnetic radiation source is positioned outside of the hemispherical shape, such that the radio frequency generated by the electromagnetic radiation source passes through the opening before interacting with the sample.

Alternatively or additionally, the panel and the additional panels are collectively located on a plurality of slices. The plurality of slices are positioned to form an entirety of the hemispherical shape and the hemispherical shape has at most one opening.

Alternatively or additionally, further including circuitry configured to receive the signal output from the radio frequency sensor of each of the panels.

Alternatively or additionally, the circuitry is further configured to apply a transform to each of the received output signals to determine the frequency and the directionality of the radio frequency input received by the panel that resulted in the received output signal.

According to another aspect, there is provided a measurement system including a plurality of panels. Each of the panels includes an electrically conductive top plate, an electrically conductive ground plate, a dielectric layer, and a radio frequency sensor. The top plate includes a radio frequency metamaterial surface configured to encode a frequency and directionality of a radio frequency input received from a sample to produce an encoded radio frequency signal. The dielectric layer includes a substrate located between the top plate and the ground plate. The radio frequency sensor is operatively coupled to the top plate and is configured to detect the encoded radio frequency signal and output a signal based on the detected encoded radio frequency signal. The panels are arranged across a concave hemispherical surface.

Alternatively or additionally, the radio frequency metamaterial encodes the radio frequency input as the encoded radio frequency signal by shifting a property of the radio frequency input based on a location on the panel where the radio frequency input was received. The property is at least one of a frequency, a phase, or an amplitude of the encoded signal.

According to a further aspect, there is provided a method for measuring a bidirectional reflectance distribution function (BRDF). The method includes receiving a radio frequency input from a sample using a panel including a radio frequency metamaterial. The radio frequency metamaterial encodes a frequency and directionality of the received radio frequency input as an encoded radio frequency signal. The encoded radio frequency signal is detected using a radio frequency sensor operatively coupled to the radio frequency metamaterial. A signal from the radio frequency sensor is outputted based on the encoded radio frequency signal.

Alternatively or additionally, the metamaterial surface includes one or more patterns. Each pattern of the one or more patterns is sensitive to a predetermined wavelength range of electromagnetic radiation such that, when electromagnetic radiation in the predetermined wavelength range is incident upon the pattern, the encoded radio frequency signal is generated in the top plate.

Alternatively or additionally, the radio frequency metamaterial encodes the radio frequency input as the encoded radio frequency signal by shifting a property of the radio frequency input based on a location on the top plate where the radio frequency input was received. The property is at least one of a frequency, a phase, or an amplitude of the encoded signal.

Alternatively or additionally, a transform is applied to the received output signal to determine the frequency and the directionality of the radio frequency input received by the panel that resulted in the received output signal.

Alternatively or additionally, the transform is determined by: receiving a known radio frequency input having known frequency and directionality; and determining the transform that converts the signal output to the known radio frequency input.

Alternatively or additionally, radio frequency generated by a radio frequency source is directed onto the sample. The generated radio frequency is altered by the sample to create the radio frequency input that is received using the panel.

While a number of features are described herein with respect to embodiments of the invention; features described with respect to a given embodiment also may be employed in connection with other embodiments. The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

The present invention is now described in detail with reference to the drawings. In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

DETAILED DESCRIPTION

Radio frequency signals (0.5-50 GHz) interact with many electromagnetic materials, making it difficult to visualize the bistatic (or even monostatic) response of a sample. Economical hardware in the radio frequency regime support coherent measurements from a large number of sensors to reconstruct an image of the properties of a sample. However, it is difficult to make spatially coherent measurements across a large area to achieve the resolution required for applications such as highly accurate anisotropic material measurements, metamaterials, and other novel material compositions used in the reflection community.

Radio frequency metamaterials are a class of engineered materials that can be configured to have properties not normally found in nature. Metamaterials can offer high anisotropic behavior, cloaking, scattering engineering, and refractive index modulation. As more unique materials and targets are developed, advanced measurement systems are needed to measure the radio frequency (RF) properties of these materials.

A device is needed that mimics the selective sensing and frequency separation capabilities of larger monostatic reflection measurement systems in a measurement device that measures angular performance of sample reflectivity or bistatic reflection that include diffuse and specular RF components.

Traditional methods of performing 0.5 GHz-50 GHz imaging rely on either sampling an aperture with a dense array of sources for beam forming (e.g., active electronically scanned antennas) or mechanically scanning a transceiver over the aperture (e.g., synthetic aperture radar (SAR) systems). Mechanically scanning a transceiver over the aperture has slow acquisition times. Conversely, sampling an aperture with a dense array of sources has improved acquisition times, but requires expensive hardware. Both of these techniques sample the aperture at half the free space wavelength (Nyquist condition) that allows beam forming or image construction using fast Fourier transform (FFT) techniques.

Computational imaging approaches have become more ubiquitous and realizable with reduced hardware and software constraints. This enables alternative sensor architectures to be investigated in the 0.5 GHz-50 GHz RF regime. For example, coded apertures allow for a single sensor pixel to be used as an imaging system (reducing costs by utilizing a single sensor compared to an array of sensors). In such a system, energy reflected from a scene is passed through a series of masks (each mask having a spatially varying transparency) which is then focused to a detector. In this way, such systems take information from a scene with complex reflection characteristics and multiplex this information across many measurements that are not orthogonal when using computational imaging techniques/algorithms. This inhomogeneous mask and detector combination may be realized as a large antenna aperture that measures complex radiation patterns and modes. By trading off complex modes and processing through the diversity of frequencies, multiple detectors can be avoided to reduce cost and difficulties in assembling in tight volume constraints.

The measurement system described herein uses metasurface panels (also referred to as apertures) to produce specific mode patterns as a function of frequency. These panels may acquire reflection information from a sample using only a frequency sweep from a single source and no moving parts. By using metasurfaces (i.e., 2D metamaterials in a plane), waves go through a single metamaterial layer, which minimize issues associated with volumetric metamaterials (e.g., unique scattering modes that could provide information not relevant to the target measurement desired). By using the scattering capabilities of metasurfaces with computer processing (e.g., computational imaging algorithms), complex reflection modalities of highly anisotropic, inhomogeneous, non-local, and nonlinear coupons and/or objects can be imaged.

Figure 1:
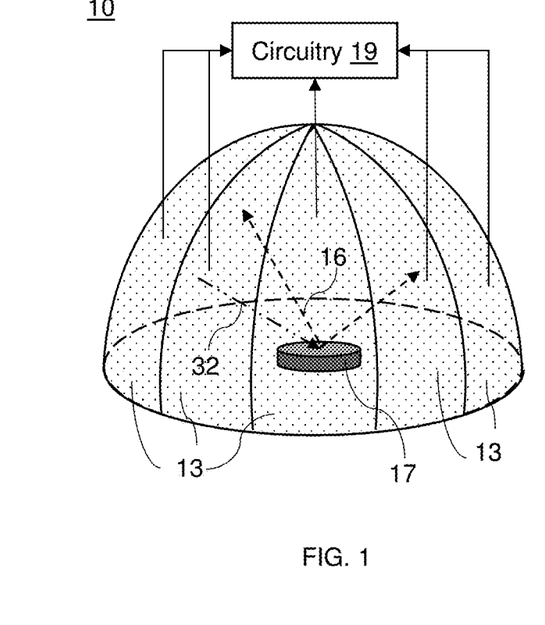
FIG. 1 is a schematic diagram of an exemplary measurement system formed from multiple slices.
Figure 2:
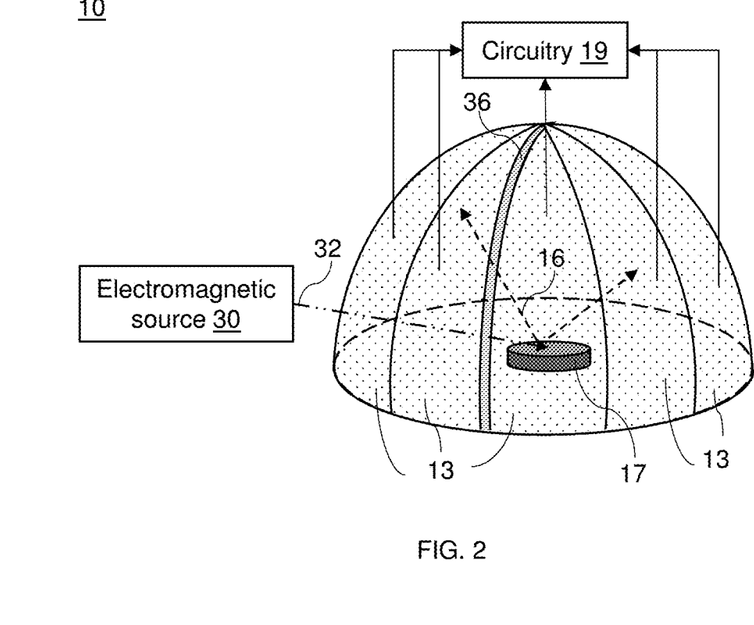
FIG. 2 is a schematic diagram of a measurement system including an external electromagnetic radiation source.

Turning to FIGS. 1 and 2, in a general embodiment, a measurement system 10 is shown. The measurement system 10 utilizes metamaterials and compressive sensing for measuring scattering radio frequency profiles. The measurement system 10 includes one or more panels (also referred to as radio frequency apertures) 12.

In the embodiment shown in FIGS. 1 and 2, the measurement system 10 has a hemispherical shape formed by panels 12 located on multiple slices 13. For example, the measurement system 10 may include multiple slices 13 and each slice 13 may include multiple panels 12.

Each panel 12 is formed from an electrically conductive top plate 22, an electrically conductive ground plate 24, a dielectric layer 26, and a radio frequency sensor 18 (also referred to as an electromagnetic sensor). The dielectric layer 26 includes a substrate 27 located between the top plate 22 and the ground plate 24. The top plate 22 includes a radio frequency metamaterial surface 14 (also referred to as a metamaterial or metamaterial pattern) configured to encode a frequency and directionality of a radio frequency input 16 received from a sample 17 to produce an encoded radio frequency signal 15. The radio frequency sensor 18 is operatively coupled (also referred to as electrically coupled) to the top plate 22 and is configured to detect the encoded radio frequency signal 15 and output a signal based on the detected encoded radio frequency signal 15.

In the embodiment shown in FIG. 1, each panel 12 is made of a metamaterial that guides received radio frequency energy 16 (also referred to as the radio frequency input signal) into a radio frequency sensor 18. In the depicted embodiment, each panel 12 is capable of measuring 0° to 90° in elevation of radio frequency spatial energy. For example, the measurement system 10 may include 18 to 72 radio frequency panels 12. The sample 17 (e.g., a single coupon in reflectance mode or an electromagnetic radiation source) is located at the center of the measurement system 10, such that the sample is surrounded by the radio frequency panels 12 covers 360° of azimuth.

Each panel 12 may be formed by etching metamaterial elements onto the top plate of a double-sided copper-plated dielectric layer. To excite the guided mode, the radio frequency sensor 18 (e.g., a coaxial SMA probe) may be inserted through the ground plate 24 into the substrate 27 and soldered to the top plate 22. A capacitive gap 35 around the soldering joint may be used to improve impedance matching. Adhesive copper tape (not shown) may also be applied along the panel's periphery to prevent electrical leakage.

The metamaterial surface 14 may include one or more patterns 28 and each pattern 28 may be sensitive to a predetermined wavelength range of electromagnetic radiation. Each pattern 28 being sensitive to a predetermined wavelength range of electromagnetic radiation refers to the encoded radio frequency signal being generated in the top plate when electromagnetic radiation in the predetermined wavelength range is incident upon the pattern.

This approach to panel 12 construction using a metamaterial surface 14 is advantageous, because the radio frequency performance of an engineered metamaterial surface (also referred to as a metasurface) combined with an imaging system across multi-spectral radio frequency bands that can obtain the full $2\pi$BRDF in one capture.

In a general embodiment, the metamaterial surface 14 includes one or more patterns 28. The metamaterial patterns 28 may be sub-wavelength structures that allow for the control of wave physics. The patterns 28 may vary spatially across the top plate 22, such that different locations along the top plate 22 are sensitive to different wavelength ranges of electromagnetic radiation. Each panel 12 may be created using engineered metamaterial cell properties. In an embodiment, each metamaterial pattern 28 (also referred to as a unit cell) has a dispersive frequency modulation whereby the patterns determine their resonating frequencies. This control may be in the form of changing the wave direction (refraction, typically with the real part of a material parameter) or in attenuation (absorption, typically with the imaginary part of a material parameter). Metamaterials are typically two-dimensional (2D) surfaces with metamaterials being 3D structures.

The metamaterials may be made from assemblies of patterns that are sub-wavelength (e.g. λ/8 to λ/30) elements fashioned from composite materials such as metals and/or dielectrics. The materials may be arranged in repeating and non-repeated patterns at scales that are smaller than the wavelengths of the phenomena they influence. In an embodiment, the metamaterials acquire their properties not from the properties of the base materials, but from their structures with effective properties at a larger scale (typically macro-scale level). By controlling the shape, geometry, size, orientation and placement of the metamaterial, acoustic, electromagnetic, or other type of waves may be controlled. This control is accomplished by blocking, absorbing, enhancing, or bending waves that achieve characteristics not normally possible with conventional materials.

The radio frequency metamaterial encodes independent electromagnetic signals coming from different spatial locations by creating dispersive (frequency-dependent) and inhomogeneous (spatially complex) modes. The physical encoding provided by the metamaterial surface 14 may utilize multiple degrees of freedom (including complex terms) in the spatial and temporal domain. By applying a transform (described in further detail below) to the received encoded radio frequency signal, the direction and characteristics of a given electromagnetic wave may be determined.

The panel 12 (e.g., for measuring in the 0.5 GHz-50 GHz electromagnetic radiation) may be manufactured using standard printed circuit board manufacturing techniques. For example, the metamaterial patterns may be etched in the top plate 22 using any suitable technique, such as lithography methods.

The top plate 22 may be made of metal and the pattern 28 may be formed from metal by at least one of adding metal to a surface of the top plate 22 or altering the metal of the surface of the top plate. For example, the pattern 28 may be formed by etching the top plate 22.

Figure 5:
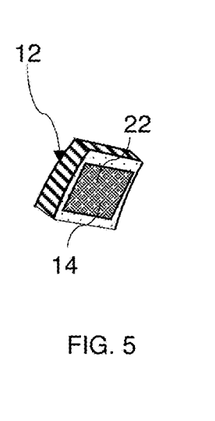
FIG. 5 is a schematic diagram of an interior surface of a panel from the slice of FIG. 3.
Figure 6:
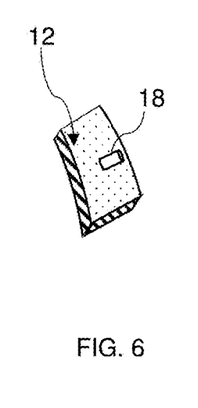
FIG. 6 is a schematic diagram of an exterior surface of a panel from the slice of FIG. 3.
Figure 7:
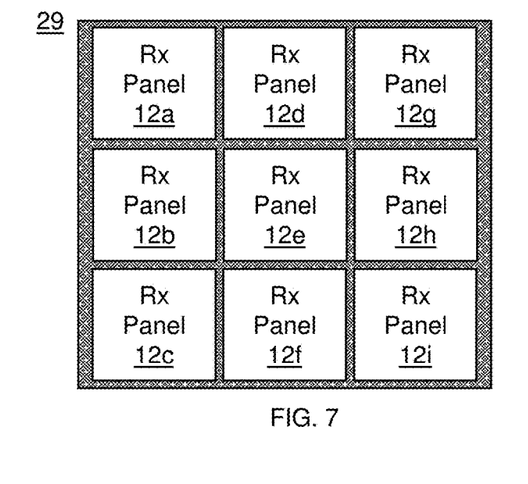
FIG. 7 is a schematic diagram of a transmitting panel.
Figure 8:
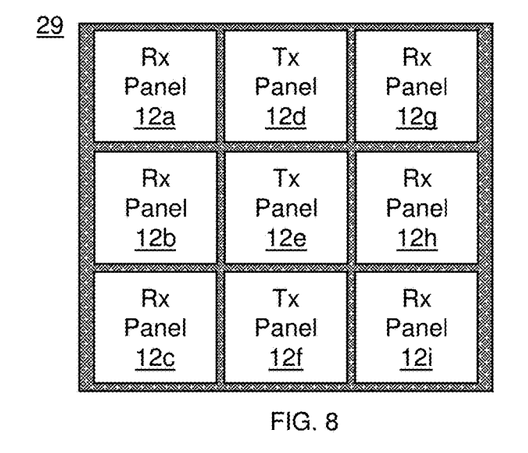
FIG. 8 is a schematic diagram of a receiving panel.

As described above, the measurement system 10 may include multiple slices 13, with each slice including multiple radio frequency panels 12. A location of a top plate 22 of a panel 12 located on a slice 13 is shown in FIGS. 5 and 6. To avoid aliasing in images reconstructed by the measurement system 10 based on the output from the panels 12, the panels 12 may be grouped as tiles 29 (e.g., for ease of mechanical mounting). For example, as shown in FIG. 7 the panels 12 may be grouped on a receive tile 29 with each panel configured to received electromagnetic energy. Similarly, as shown in FIG. 8, the panels 12 may be grouped on a transmit tile 29 with at least one panel 12 on the tile 29 configured to transmit electromagnetic energy. In this example, a specific transmitting tile 29 may be excited by a frequency sweep and measurements may be taken in a round-robin style by the receiving panels. Hence, the total number of measurements from the hemispherical system is the 24×144×$f_{num}$ whereby $f_{num}$ is the number of frequencies that are measured by the operator. Measurements may be taken from each pair of transmission/receiving tiles 29 using a switch-based signal distribution network.

Each radio frequency panel 12 may be made of low-loss, copper clad printed circuit substrate whereby the top 22 and bottom 24 bounding copper layers create a dielectric cavity due to a via fence at the outside of the tile (i.e., a row of via holes spaced close enough together to form a barrier to electromagnetic wave propagation of slab modes in the substrate). The radio frequency sensor (e.g., a coaxial connector) may feed a cylindrical coplanar waveguide mode into the cavity at an off-center point to send energy to the sample being imaged. A plurality of patterns 28 (e.g., a series of subwavelength shapes) sample the waveguide mode and send or receive the electromagnetic radiation.

As described above, each panel 12 may have multiple patterns (also referred to as sub-wavelength shapes) for transmitting or receiving energy. Each slice 13 may be capable of measuring 0° to 90° in elevation of RF spatial energy. A single sample 17 (in reflectance mode) or electromagnetic source at the center may be surrounded by a number of panels that cover 360° of azimuth (e.g., 18 to 72). Each panel may possess a unique and highly frequency-dependent response, which is generated by the RF feeds with specific resonant dispersion. As described herein, the measurement modes of the measurement system 10 may be complex in both the spatial and spectral dimensions. This location-dependent frequency modulation provides both spatial and spectral resolution. The level of randomization and size of the panels and corresponding metamaterial patterns may determine the supported resolution, bandwidth, and the multiplexing capability of the measurement system 10.

The spatially varying waveguide modes (e.g., located inside the dielectric) send energy to the patterns 28, which in turn produce distinct radiation patterns that vary as a function of the driving frequency. Because each panel has a limited number of frequency diverse measurements available to it, the measurement system 10 may utilize multiple radio frequency panels (e.g. 24 transmitting and 144 receiving, etc.). Each panel could be 1.8 m×1.8 m (6 feet×6 feet) and many of these panels are distributed over the entire inside hemispherical dome surface. As an example comparison to a typical Naval Research Lab (NRL) arch that has a radius of 1.5 m (5 feet), the measurement system 10 described herein may have an approximate surface area of about 14.6 m² (157 square feet) (which is approximately a coverage of about 157×4=628 panels).

Figure 3:
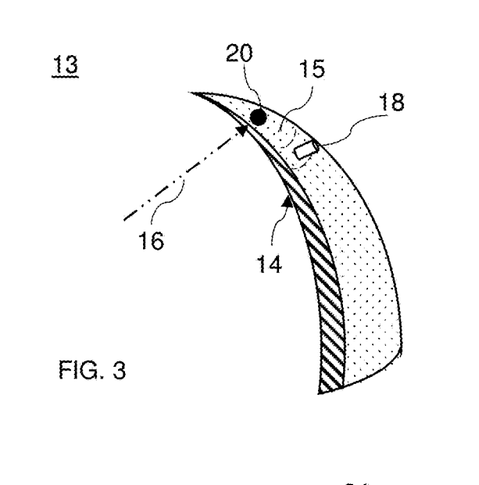
FIG. 3 is a schematic diagram of a slice from the measurement system of FIGS. 1 and 2.

In the embodiment shown in FIG. 3, the radio frequency metamaterial encodes the radio frequency input 16 as the encoded radio frequency signal 15 by shifting a property of the radio frequency input 16 based on a location 20 on the radio frequency panel 12 where the radio frequency input was received. The property altered in the encoded radio frequency signal 15 may be one or more of a frequency, a phase, or an amplitude of the encoded signal 15.

In an embodiment and as a non-limiting example, a particular radio frequency input 16 having a given frequency is encoded by the panel 12, such that a frequency of the encoded radio frequency signal 15 is shifted from the given frequency by a frequency value dependent on a location 20 of the panel 12 that the particular radio frequency input 16 interacted with the panel 12. For example, if the radio frequency input 16 is a wave of electromagnetic radiation having a frequency of 40 GHz that interacts with a single location 20 on the panel 12, the encoded radio frequency signal 15 may have a frequency of 39.9 GHz. This difference (i.e., 0.1 GHz) in the frequency of the encoded radio frequency signal 15 and the radio frequency input 16 is used to encode the location 20 on the metamaterial 14 that received the radio frequency input 16. If the same radio frequency input 60 (i.e., 40 GHz) was received by a different location of the metamaterial 14, the encoded signal 15 would have a different frequency (e.g., 40.1 GHz) depending on properties of the metamaterial.

In an embodiment, the pattern 28 includes scattering unit cells at normal angles of incidence and does not take into account the variation of the wavelength response at oblique angles of incidence. To make sure the wavelength response of the metamaterial surface 14 of the panel 12 becomes polarization insensitive at normal incidence, the pattern 28 may include symmetrical array elements (e.g., crosses, square patches, etc.); however, this is not necessarily the case at oblique angle of incidences (AOIs) because the wavelength response shifts in frequency and becomes polarization dependent. To compensate for angle and frequency issues (as well as increased bandwidths), layers having different electric permittivity/relative magnetic permeability layers may be used in conjunction with metamaterial unit cells. Metamaterial structures may be modeled over large bandwidths for different AOIs and polarization using finite element modeling (FEM). The scan and wavelength compensations require electromagnetic layers with higher material properties and when proper layers are used, materials with fewer layers can offer better bandwidths. Polarization may be approximated by an equivalent model for the material structures, but may also backed up with full-wave solutions as well.

The metamaterial surface 14 may also include resonating metamaterial elements; but, if resonating metamaterial elements are used, the bandwidth may be limited. However, if nonresonant elements are used, the advantages of both metamaterials and larger bandwidths may be realized. An example of one of the subwavelength shapes (whereby many subwavelength shapes make up the pattern 28) is shown in FIG. 4.

In FIGS. 1 and 2, the external surface of the measurement system 10 is shown partially transparent so that the sample 17 located at a central point of the system 10 is visible. In FIG. 3, a slice 13 from the measurement system 10 of FIGS. 1 and 2 is shown with a location 20 identified that the radio frequency input 16 interacts with the metamaterial. In this embodiment, the measurement system 10 is capable of measuring full 27 spatial and temporal effects of isolated electromagnetic radiation sources or Bi-Reflection Coupon characteristics. In the depicted embodiment, the measurement system 10 has a hemispherical shape formed from multiple slices 13 including multiple radio frequency panels 12.

In the embodiment shown in FIG. 1, the top plate 22 may be configured to generate electromagnetic radiation based on an input signal received from the radio frequency sensor 18, such that the generated electromagnetic radiation is emitted by the top plate 22 and interacts with the sample 17 and is received as the radio frequency input 16 by the radio frequency metamaterial. For example, the top plate 22 may be a metallic layer deposited onto a first surface of the dielectric 26 and the ground plate 24 may be another metallic layer deposited onto a second surface of the dielectric 26 opposite the first surface.

Figure 4:
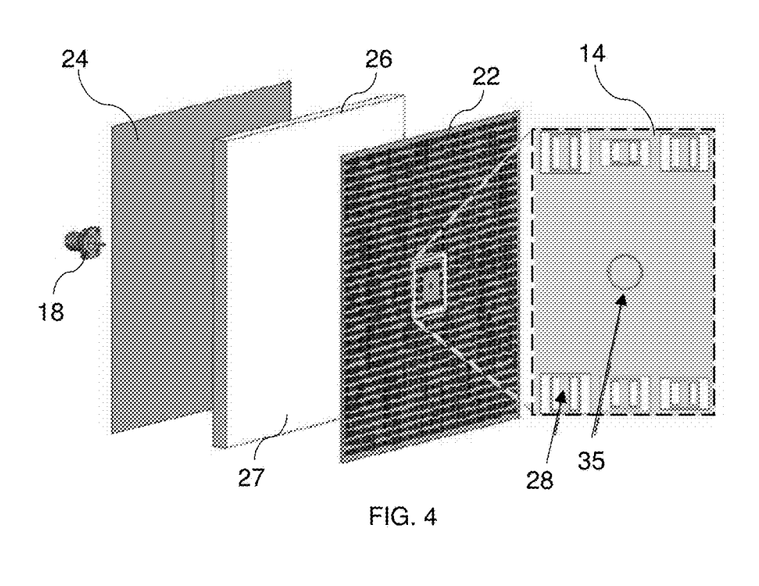
FIG. 4 is an exploded schematic diagram of a panel.

As shown in FIG. 4, the radio frequency sensor 18 may be inserted through the ground plate 24 and the substrate 27 and the radio frequency sensor 18 may be electrically connected to the top plate 22. The top plate 22 may include a capacitive gap surrounding an area where the radio frequency sensor 18 makes electrical connection with the top plate 22. The top plate 22 and the ground plate (also referred to as a bottom plate) 24 may be made of any suitable electrically conductive material. For example, both the top plate 22 and the ground plate 24 may be made of copper.

The top plate 22 and the ground plate 24 are both made from electrically-conductive materials. For example, the top plate 22 and the ground plate 24 may both be made from materials having an electrical conductivity of $4 \times 10^7 - 6 \times 10^7$ σ (S/m) at 20° C.

As described above, each panel 12 may include a radio frequency sensor 18 (also referred to as an electromagnetic sensor). The radio frequency sensor 18 may take the form of any suitable device for detecting electromagnetic radiation and generating a corresponding electrical signal. For example, the radio frequency sensor 18 may be a coaxial probe. As described above, the radio frequency sensor 18 may also be used to provide a signal to cause electromagnetic energy emission by one or more of the panels 12 of the measurement system 10.

In the embodiment shown in FIG. 2, the measurement system 10 includes circuitry 19. The radio frequency sensors 18 output a signal based on the detected encoded radio frequency signal 15 that is received by the circuitry 19.

To determine the imaging capabilities of the panels, a plane-wave decomposition of the modes that are radiating may be performed and the panels spatial frequencies may be mapped. The distribution of the patterns on the metamaterial surface 14 (e.g., the sub-wavelength shapes) determines the Fourier space that is accessible by the panel and the variation of the modes in the cavity determines the specific Fourier components that are sampled at each measurement mode. Maximizing the set of useful frequencies in the measurements may depend on maximizing the diversity of the fields being radiating. These radiated fields are determined, e.g., by the topology/geometry of each of the panels.

To support the same k-space as a densely spaced iris layout, slot shapes may be used that are oriented horizontally, at the top and bottom of the transmitter panels; and vertically, at the left and right of the receiver panels. This sparse distribution provides the same k-space support as a densely spaced sub-wavelength space layout.

Golay patterns, which are used in the radio astronomy community, may be useful for their use of minimally redundant antenna distributions. By minimizing the number of radiation channels, the phase accumulation is statistically increased along the different scattering paths inside the cavity, which in turn, may manifest as increased mode diversity between frequency steps (widening the impulse response).

The number of distinct frequency measurements made by the measurement system 10 may determine the maximum dimension of the measurement space that can be measured, and hence the number of spatial components that can be observed. In any given tile 29, an ideal condition may be when the number of distinct frequency measurements is proportional to the number of subwavelength shapes (also referred to as patterns) squared (each subwavelength shape is composed of the number of radiating irises on each metasurface panel, transmitting and receiving).

Fabricating the panels 12 may require balancing between the material loss, size, the number of radiating patterns as well as other hardware. For example, a compromise may be made between maximizing spatial frequency sampling and maintaining the necessary signal-to-noise of the system 10. For example, some panels 12 may have an average radiation efficiency of $\eta \approx 30\%$ but with proper modeling the optimization may be boosted higher.

To have a full measurement of a sample 17 (also referred to as a target or coupon), the sample may be illuminated from varying perspectives to demonstrate the multi-dimensional nature of the BRDF/bistatic reflection. For example, the sample 17 may be painted with conductive paint to approximate the high reflectivity characteristics of a real world asset. As an example, conductive targets in the 0.5 GHz-50 GHz region often exhibit strong specular reflection coefficients due to their high conductivity and low surface roughness (with respect to the illumination wavelength), regardless of the imaging approach used. This reduces the viewing angle, in contrast to the diffuse scattering more commonly observed at other wavelengths.

The complete characterization of the spatial field distribution corresponding to each of the panels 12 may be necessary to reconstruct an image of the scatter caused by the sample 17 as well as an accurate model for object scattering. In a computational imaging system, the accuracy of the model or coupon dictates image fidelity. For certain perfect electric conductor (PEC) surfaces, one can presume that the electric field reflected by a volume element is directly proportional to the incident field, $E_{ref}(r)=f(r)E_{inc}(r)$. This may work well for calibration purposes if the target has a PEC surface, but it neglects both material dispersion and assumes isotropy. Many unique samples may be dispersive and anisotropic. Calibration and constructing the image of the sample may be performed using machine learning approaches to capture the nonlinearities typically found in such processing.

If the space imaged by the measurement system 10 is divided into discrete volume elements (voxels) the relationship between the field measurements and reflectivity values may take the form of a matrix equation g=Hf+n, where $H_{ij} \propto E_i^{Tx}E_j^{Rx}$ are the elements of an M×N measurement matrix and n is noise in the system. The measurement matrix (H) elements are proportional to the field from the transmission panel at a given point in space and multiplied by the field from the receiving panel at the same point. If one has a complete set of orthogonal modes that have been measured and does not consider the noise, the reflectivity of the system may be found via matrix inversion. In systems that involve correlation, this may not happen directly. For this reason, image reconstruction may be found for the reflectivity which minimizes the function mini‖g−Hf‖. The reflectivity that minimizes the function may be found using different types of algorithms, such as least squares.

Figure 9:
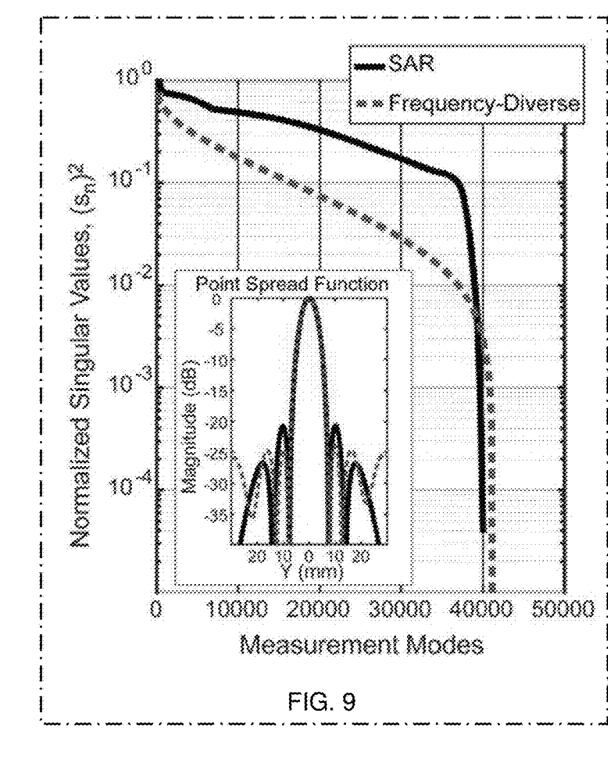
FIG. 9 is a plot of measurement modes vs normalized singular values including an inset point-spread-function (PSF).

The resolution of the measurement system 10 in terms of range relates to the operational bandwidth, $\delta r=c/2B$, while the cross-range resolution is determined by the aperture size, $\delta c=\lambda_{min}D/L$. The wavelength is defined as $\lambda_{min}$, D is the distance to the target, and L is the aperture width. These estimates suggest resolution limits of a few mm for $\delta c$ and $\delta r$ for interrogating frequencies around the 20 GHz range. The achieved resolution of the metasurface imager, however, is dependent on the actual sampling of the k-space. Reconstructions over a subset of the volume can still achieve diffraction limited resolution even if the aperture is sampled sparsely. The singular value decomposition (SVD) of H provides a useful means of assessing the system's imaging capacity while a nearly flat singular value spectrum signifies greater orthogonality of the measurements modes (a decaying spectrum signifies redundancy in the measurements modes). It should be noted that the SVD of the measurement matrix can be used as a means of quantitatively assessing the cross-range measurement capacity of the system. FIG. 9 shows the singular value spectrum of a frequency-diverse metasurface system for a finite number of planar panels facing a target and a similarly sized monostatic SAR system. The measurement matrix for the comparable Synthetic Aperture Radar system possesses a nearly flat singular value spectrum as shown in FIG. 5. However, the measurement system 10 may contain non-orthogonality of its measurement modes which results in a decaying slope.

With sufficient signal-to-noise ratio and appropriate algorithmic approaches, it is possible to acquire a majority of the information available in the scene. Leveraging frequency diversity helps eliminate the need for mechanical scanning or a vast number of switched elements to reach the ~80,000 Nyquist sampled measurements across the entire aperture, as would be needed for synthetic aperture radar imaging. In this example, there are 168 switching channels for the measurement system 10, for which the swept frequency measurements may be made extremely fast using current CW RF equipment. This allows the system to obtain fast imaging rates rivaling electronic SAR systems, but at much lower component costs comparable to mechanically scanned SAR systems. For potential monostatic, bistatic, and BRDF imaging applications, such as spatially complex reflection profiles of a target or novel metamaterial coupons, the imaging volume may be physically large. To reduce the effective size of the imaging volume, a "bounding box" may be generated (e.g., by a user) around the target in the total hemispherical volume to help reduce the extent of the reconstruction region, potentially greatly reducing processing requirements to construct the image.

To decode the radio frequency signal 15 detected by the radio frequency sensor 18, a sample 17 having known radio frequency properties may be placed into the measurement system 10 to calibrate the system 10. As described above, electromagnetic radiation may be directed onto the sample 17 or the sample 17 may be caused to emit electromagnetic radiation. In either case, the radio frequency input 16 from the sample 17 is received by the radio frequency panels 12, encoded as a radio frequency signal 15 and detected by the radio frequency sensor 18. Because the radio frequency properties of the sample 17 are known, a transform may be determined that converts from the signal output by the radio frequency sensor 18 to the frequency and directionality of the radio frequency input 16.

The transform may be determined using any suitable signal processing technique including machine learning, Fourier analysis, wavelet processing, etc. Determining the transform may be performed using the circuitry 19 or another computer system. In either case, the circuitry 19 may store the necessary transform(s) for the measuring system 10 in a non-transitory computer readable medium. In the embodiment shown in FIG. 2, the circuitry 19 applies the transform to each of the received output signals to determine the frequency and the directionality of the radio frequency input received by the panel 12 that resulted in the received output signal.

The circuitry 19 may have various implementations. For example, the circuitry 19 may include any suitable device, such as a processor (e.g., CPU), programmable circuit, integrated circuit, memory and I/O circuits, an application specific integrated circuit, microcontroller, complex programmable logic device, other programmable circuits, or the like. The circuitry 19 may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the circuitry 19.

The circuitry 19 may be communicatively coupled to the computer readable medium and network interface through a system bus, mother board, or using any other suitable structure known in the art.

In one embodiment, the transform to decode between the encoded radio frequency signal 15 and the radio frequency input 16 varies between radio frequency panels 12, so that different transforms may be determined for each of the radio frequency panels 12 of the system 10.

Calibration samples 17 may include metamaterial patterns to control reflectance properties. For example, the calibration sample may include metamaterial patterns causing incoming illumination to provide extremely anisotropic responses out of plane whereby the primary spectral lobe is not radiating along the same direction in the original incidence plane but rather radiating its primary spectral lobe in a plane that is of a different orientation relative to the first.

FIG. 2 displays a general example of a BRDF measurement system with an external electromagnetic radiation source 30. The electromagnetic radiation source 30 is positioned outside of the hemispherical shape such that electromagnetic radiation generated by the electromagnetic radiation source 30 interacts with the sample 17 and is received as the radio frequency input 16 by at least one of the radio frequency panels 12. In this embodiment, the measurement system 10 has the benefit over a naval research lab (NRL) arch with one transmitting horn in that the measurement system 10 may measure all possible azimuths and elevations for the received RF energy.

In the depicted embodiment, the radio frequency panels 12 are arranged on slices 13 such that at least two neighboring slices 13 are physically separated by an opening 36. The electromagnetic radiation source 30 is positioned outside of the hemispherical shape, such that the electromagnetic radiation 32 generated by the electromagnetic radiation source 30 passes through the opening 36 before interacting with the sample. In one embodiment, the measurement system 10 includes multiple openings 36 and/or multiple electromagnetic radiation sources 30.

As opposed to an external electromagnetic radiation source, in the embodiment shown in FIG. 2, the radio frequency metamaterial is used to generate electromagnetic radiation 32, such that the generated electromagnetic radiation 32 interacts with the sample 17 and is received as the radio frequency input 16 by the radio frequency metamaterial. In the embodiment shown in FIG. 1, the sample 17 generates the radio frequency input 16. For example, the sample 17 may be an antenna or any other source of radio frequency electromagnetic radiation.

The electromagnetic source 30 may be any suitable source (s) of electromagnetic radiation. For example, the electromagnetic source 30 may comprise a number of electromagnetic emitters. The electromagnetic source 30 may emit radio frequency energy having a wavelength range of, but not limited to, 0.5 GHz-50 GHz. The electromagnetic source 30 may be tunable to specific wavelengths. For example, the electromagnetic source may include multiple electromagnetic emitters that each emit a particular sub range of radio frequency energy.

Using multiple, yet frequency-overlapping, electromagnetic emitters (e.g., transmitting panels or external sources) may allow for better frequency coverage for particular frequency bands, because some sources of electromagnetic radiation may perform poorly towards the edges of their outputting wavelength range. The output of the panels 12 (e.g., phase and quadrature phase data) from the sensor 18 may be output to the circuitry 19 for generating an image. To measure weak return signals from small objects or extremely absorbing samples, a very low noise floor (e.g. −90 dB to −110 dB) may be needed, especially if the objects being imaged are dielectrics that have electric permittivity values close to one.

As described above, in FIGS. 1 and 2, the radio frequency panels 12 include at least two sets of neighboring radio frequency panels 12, each set of neighboring radio frequency panels 12 including two radio frequency panels 12 in physical contact with one another. The receiving surface of the slices 13 may form an entirety of the hemispherical shape. The receiving surface of the slices 13 may also form an entirety of a spherical shape.

The measurement system 10 may be formed from multiple panels 12, such that the top plates 22 of the radio frequency panels 12 form at least a portion of a hemispherical shape. For example, as opposed to forming a complete hemisphere, the measurement system 10 may cover only a portion of a hemisphere. For example, the panel 12 shown in FIG. 7 may be used by itself to measure a property of electromagnetic radiation coming from a sample 17.

As described, samples 17 having known electromagnetic properties may be used to calibrate the system 10 to determine a transform for decoding the signal(s) output by the radio frequency sensor(s) 18. For example, the sample 17 (also referred to as a coupon) may include subwavelength structures and patterns for novel spatial reflectance properties (i.e. incoming electromagnetic radiation provides extremely anisotropic responses out of plane whereby the primary spectral lobe is not radiating along the same direction in the original incidence plane but rather radiating its primary spectral lobe in a plane that is of a different orientation relative to the first), such that a single sample 17 and/or spatial source may be used to calibrate the system 10.

Figure 10:
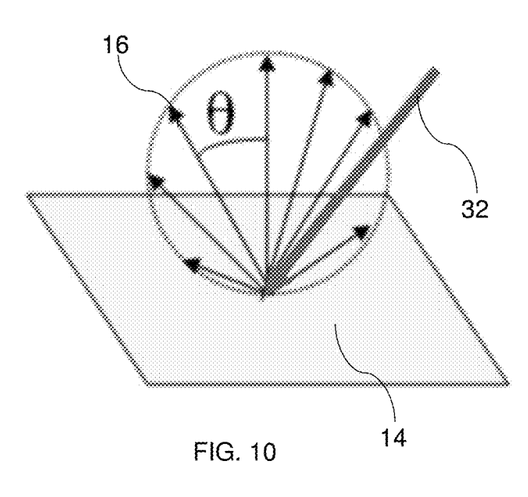
FIG. 10 depicts Lambertian surface reflectance.
Figure 11:
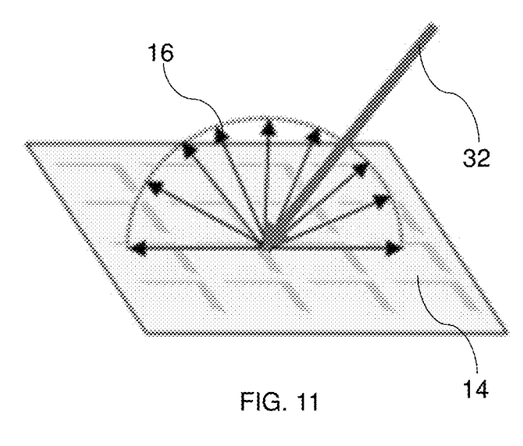
FIG. 11 depicts super Lambertian surface reflectance.

Exemplary calibration references include flat metal or dielectric materials having broadband and highly reflective specular components. However, diffuse-like reflective samples in the radio frequency regime may not be sufficient references for diffuse scattering samples. For example, a calibration reference may be selected that reflects diffusely in a Lambertian like pattern evenly across elevation and azimuthal angles, regardless of incident angle of the incoming radiation as shown in FIGS. 10 and 11. Metamaterials may be created having such properties.

In addition, metasurfaces, which are sub-wavelength structured surfaces, may also allow for the engineering of specific reflection response properties. However, one pattern may not necessarily cover the entire radio frequency regime from 0.5 GHz to 50 GHz. Instead, multiple samples may be needed at different wavelengths (e.g., with overlap) to provide diffuse-like reflectance reference for use across such a large range.

Although there exists different type of reflectance systems, an under-filled sample (also referred to as a coupon) is typically used for BRDF measurements. Under-filling is defined as the irradiation that, when it is intercepted by the sample surface, has a vast majority of its energy inside the physical sample bounds. Typically this is a circular or elliptical beam that has a full beam $1/e^2$ transverse beam profile width that is approximately one-third of the physical distance across the dimension of the sample. This is needed so that a majority of the encircled energy is captured by the coupon for the BRDF measurement. Traditionally this has been used with radio frequency horn sources and spectral filters. Although radio frequency electromagnetic radiation sources may be spectrally broad and continuous, their output power may not be enough to help induce nonlinear effects in certain samples. More modern radio frequency sources may allow for not only irradiating the surface with a higher flux of energy in a much more targeted manner, but also for novel nonlinear radio frequency material effects.

Figure 12:
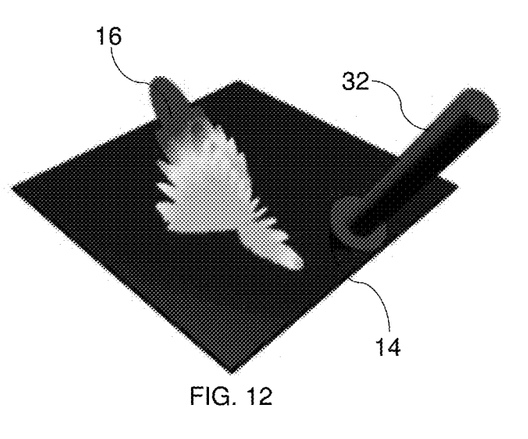
FIG. 12 is an exemplary bidirectional reflectance distribution function (BRDF) of a flat plate having typical specular lobe and weakly diffused side lobe components.
Figure 13:
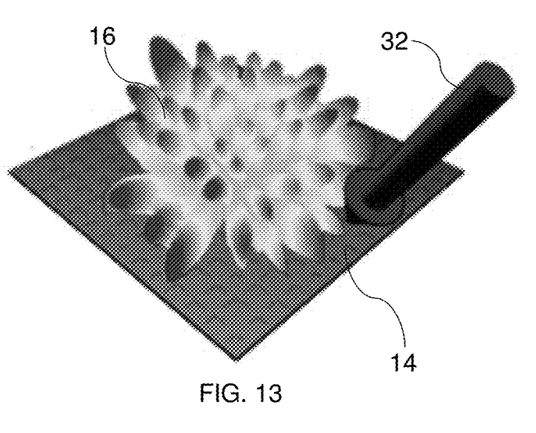
FIG. 13 is an exemplary bidirectional reflectance distribution function (BRDF) of an engineered metamaterial/metasurface that induces preferential omnidirectional scattering via subwavelength structured elements.

Most electromagnetically flat surfaces will have a specular and diffuse component of its reflection after interacting with the surface to some degree. However, when a sample for calibration is fabricated with the proper unit cells, scattering may be controlled preferentially in a $2\pi$ steradian angle. This may be accomplished with full wave electromagnetic solvers coupled with optimization techniques as shown in FIGS. 12 and 13. This is a type of forced/engineered scattering; however, many radio frequency advanced metasurfaces and metamaterials may be utilized as a calibration sample to preferentially redirect electromagnetic scattering.

Figure 14:
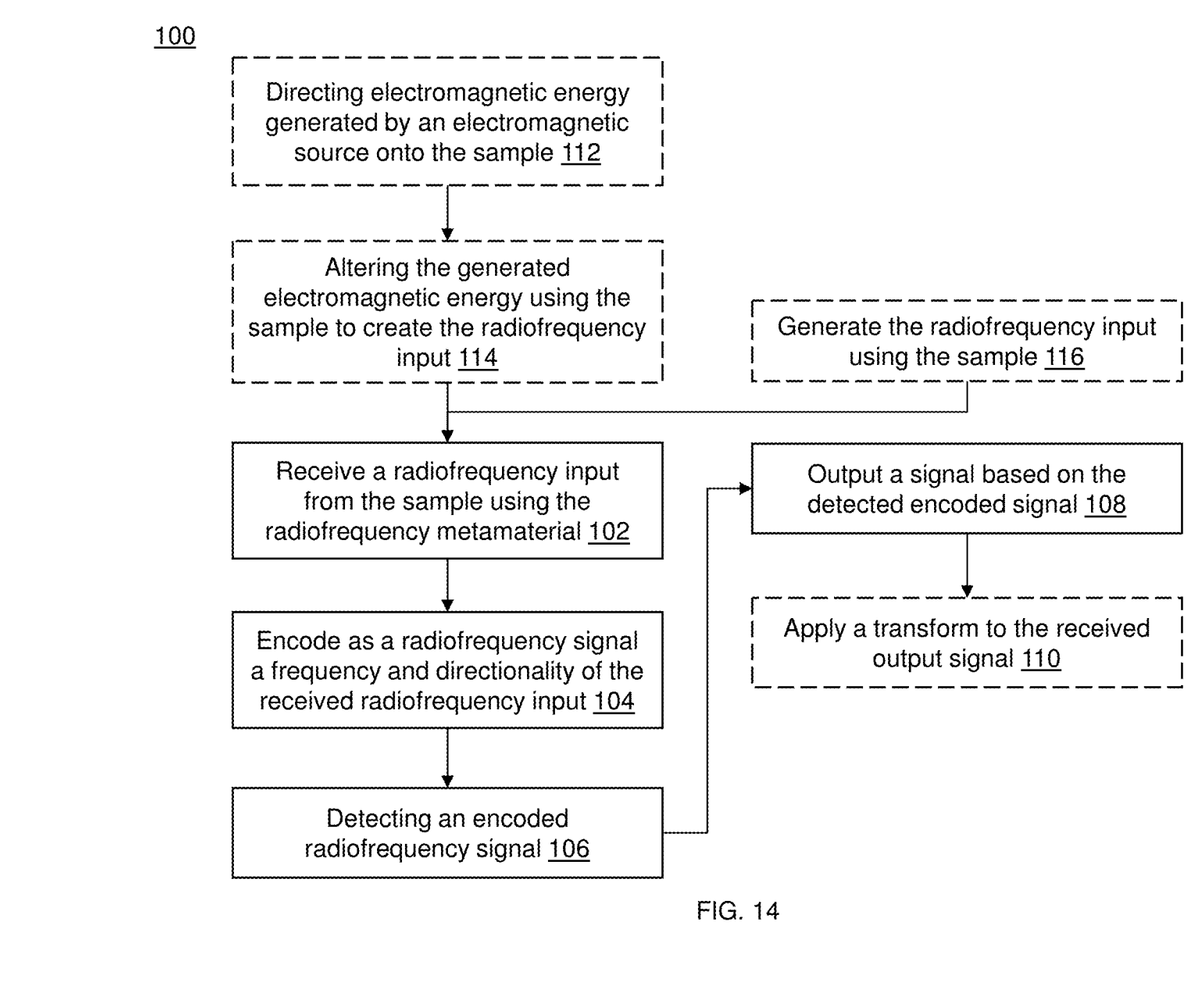
FIG. 14 is a flow diagram depicting a method for measuring BRDF in a radio frequency regime.

Turning to FIG. 14, an embodiment of a method 100 for measuring bidirectional reflectance distribution function (BRDF) in a radio frequency regime is shown. In processing block 102, a radio frequency input 16 from a sample 17 is received using a panel 12 including a radio frequency metamaterial. In process block 104, a frequency and directionality of the received radio frequency input 16 is encoded as a radio frequency signal 15 by the panel 12.

In process block 106, the encoded radio frequency signal 15 is detected using a radio frequency sensor 18 that is operatively coupled to the radio frequency metamaterial. In process block 108, a signal is output from the radio frequency sensor 18 based on the detected encoded radio frequency signal 15. In optional process block 110, a transform is applied to the received output signal to determine the frequency and the directionality of the radio frequency input 16 received by the panel 12 that resulted in the received output signal.

In optional process block 112, electromagnetic radiation 32 generated by an electromagnetic radiation source 30 is directed onto the sample 17. In optional process block 114, the generated electromagnetic radiation 32 is altered by the sample 17 to create the radio frequency input 16 that is received using the panel 12. Alternatively, in optional process block 118, instead of directing electromagnetic radiation onto the sample 17, the sample 17 generates the radio frequency input 16.

In process block 110, a transform is applied to the received output signal 110.

All ranges and ratio limits disclosed in the specification and claims may be combined in any manner. Unless specifically stated otherwise, references to "a," "an," and/or "the" may include one or more than one, and that reference to an item in the singular may also include the item in the plural.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A measurement system comprising:
a plurality of panels each including:
an electrically-conductive top plate, wherein the top plate includes a radio frequency metamaterial surface configured to encode a frequency and directionality of a radio frequency input received from a sample to produce an encoded radio frequency signal;
an electrically-conductive ground plate;
a dielectric layer including a substrate, the dielectric layer located between the top plate and the ground plate, and
a radio frequency sensor operatively coupled to the top plate and configured to detect the encoded radio frequency signal and output a signal based on the detected encoded radio frequency signal;
wherein the panels together form a shape that surrounds the sample therein, covering 360° of azimuth.

2. The measurement system of claim 1, wherein, for each of the panels:
the metamaterial surface includes one or more patterns; and
each pattern of the one or more patterns is sensitive to a predetermined wavelength range of electromagnetic radiation such that, when electromagnetic radiation in the predetermined wavelength range is incident upon the pattern, the encoded radio frequency signal is generated in the top plate.

3. The measurement system of claim 2, wherein, for each of the panels:
the one or more patterns include a plurality of patterns; and
the plurality of patterns vary spatially across the top plate, such that different locations along the top plate are sensitive to different wavelength ranges of electromagnetic radiation.

4. The measurement system of claim 2, wherein, for each of the panels:
the top plate is made of metal; and
the pattern is formed from metal by at least one of adding metal to a surface of the top plate or altering the metal of the surface of the top plate.

5. The measurements system of claim 1, wherein, for each of the panels
the radio frequency metamaterial surface encodes the radio frequency input as the encoded radio frequency signal by shifting a property of the radio frequency input based on a location on the top plate where the radio frequency input was received; and
the property is at least one of a frequency, a phase, or an amplitude of the encoded signal.

6. The measurement system of claim 5, wherein the property includes the frequency.

7. The measurement system of claim 1, wherein, for each of the panels, the top plate is configured to generate electromagnetic radiation based on an input signal received from the radio frequency sensor, such that the electromagnetic radiation is emitted by the top plate and interacts with the sample and is received as the radio frequency input by the radio frequency metamaterial surface.

8. The measurement system of claim 1, wherein the shape is a hemispherical shape.

9. The measurement system of claim 8 further comprising an electromagnetic radiation source positioned outside of the hemispherical shape such that electromagnetic radiation generated by the electromagnetic radiation source interacts with the sample and is received as the radio frequency input by at least one of the panels;
wherein the hemispherical shape includes an opening; and
wherein the electromagnetic radiation source is positioned outside of the hemispherical shape, such that the radio frequency generated by the electromagnetic radiation source passes through the opening before interacting with the sample.

10. The measurement system of claim 8, further comprising circuitry configured to receive the signal output from the radio frequency sensor of each of the panels.

11. The measurement system of claim 10, wherein the circuitry is further configured to apply a transform to each of the received output signals to determine the frequency and the directionality of the radio frequency input received by the panel that resulted in the received output signal.

12. A measurement system comprising:
a plurality of panels each including:
an electrically conductive top plate, wherein the top plate includes a radio frequency metamaterial surface configured to encode a frequency and directionality of a radio frequency input received from a sample to produce an encoded radio frequency signal;
an electrically conductive ground plate;
a dielectric layer including a substrate located between the top plate and the ground plate; and
a radio frequency sensor operatively coupled to the top plate and configured to detect the encoded radio frequency signal and output a signal based on the detected encoded radio frequency signal, wherein the plurality of panels are arranged across a concave hemispherical surface.

13. The measurement system of claim 12,
wherein the radio frequency metamaterial surface encodes the radio frequency input as the encoded radio frequency signal by shifting a property of the radio frequency input based on a location on the panel where the radio frequency input was received; and
wherein the property is at least one of a frequency, a phase, or an amplitude of the encoded signal.

14. A method for measuring a bidirectional reflectance distribution function (BRDF), the method comprising:
receiving a radio frequency input from a sample using panels that together form a shape that surrounds the sample therein, covering 360° of azimuth, each of the panels including a top plate with a radio frequency metamaterial surface; and
for at least some of the panels,
encoding with the radio frequency metamaterial a frequency and directionality of the received radio frequency input as an encoded radio frequency signal;
detecting the encoded radio frequency signal using a radio frequency sensor operatively coupled to the radio frequency metamaterial; and
outputting a signal from the radio frequency sensor based on the encoded radio frequency signal.

15. The method of claim 14, wherein, for each of the panels,
the metamaterial surface includes one or more patterns; and
each pattern of the one or more patterns is sensitive to a predetermined wavelength range of electromagnetic radiation such that, when electromagnetic radiation in the predetermined wavelength range is incident upon the pattern, the encoded radio frequency signal is generated in the top plate.

16. The method of claim 14, wherein, for each of the panels,
the radio frequency metamaterial encodes the radio frequency input as the encoded radio frequency signal by shifting a property of the radio frequency input based on a location on the top plate where the radio frequency input was received; and
the property is at least one of a frequency, a phase, or an amplitude of the encoded signal.

17. The method of claim 14, further comprising applying a transform to the signal output by the radio frequency sensor to determine the frequency and the directionality of the radio frequency input received by the panels that resulted in the signal.

18. The method of claim 17, further comprising applying the transform by:
receiving a known radio frequency input having known frequency and directionality; and
determining the transform that converts the signal output to the known radio frequency input.

19. The method of claim 14, further comprising:
directing radio frequency generated by a radio frequency source onto the sample; and
altering the generated radio frequency by the sample to create the radio frequency input that is received using the panels.

* * * * *